United States Patent
Nakashiba et al.

(10) Patent No.: US 9,871,036 B2
(45) Date of Patent: Jan. 16, 2018

(54) SEMICONDUCTOR DEVICE

(71) Applicant: RENESAS ELECTRONICS CORPORATION, Kawasaki-shi, Kanagawa (JP)

(72) Inventors: Yasutaka Nakashiba, Kanagawa (JP); Yutaka Akiyama, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 14/209,384

(22) Filed: Mar. 13, 2014

(65) Prior Publication Data
US 2014/0264722 A1 Sep. 18, 2014

(30) Foreign Application Priority Data
Mar. 18, 2013 (JP) ................................ 2013-054817

(51) Int. Cl.
*H01L 21/50* (2006.01)
*H01L 23/495* (2006.01)
(Continued)

(52) U.S. Cl.
CPC ...... *H01L 27/0688* (2013.01); *H01L 23/5227* (2013.01); *H01L 23/49541* (2013.01);
(Continued)

(58) Field of Classification Search
CPC .............................. H01L 23/49548–23/49555
See application file for complete search history.

(56) References Cited

U.S. PATENT DOCUMENTS 6,384,676 B2  5/2002  Kasa et al.
6,407,432 B1  6/2002  Nemoto et al.
(Continued)

FOREIGN PATENT DOCUMENTS

JP  05-218262 A  8/1993
JP  06-120396 A  4/1994
(Continued)

OTHER PUBLICATIONS

Communication dated Nov. 22, 2016, from the Japanese Patent Office in counterpart Japanese application No. 2013-054817.
(Continued)

*Primary Examiner* — Raj R Gupta
(74) *Attorney, Agent, or Firm* — Sughrue Mion, PLLC (57) ABSTRACT

A semiconductor chip includes a first circuit and a second circuit having different reference potentials. A first potential which is a reference potential of the first circuit is applied to the semiconductor chip through any of plural lead terminals, and a second potential which is a reference potential of the second circuit is applied to the semiconductor chip through any of plural lead terminals. A substrate of the semiconductor chip has a structure in which a buried insulating layer and a semiconductor layer of a first conductivity type are laminated on a semiconductor substrate such as a SOI substrate. A fixed potential is applied to the semiconductor substrate through a die pad and a lead terminal for a substrate potential. The fixed potential is applied to the semiconductor chip through a different route from the reference potential of the first circuit and the reference potential of the second circuit.

11 Claims, 9 Drawing Sheets

(51) Int. Cl.
   *H01L 27/12*   (2006.01)
   *H01L 25/16*   (2006.01)
   *H01L 27/06*   (2006.01)
   *H01L 23/522*  (2006.01)
(52) U.S. Cl.
   CPC ............. *H01L 2224/48091* (2013.01); *H01L 2224/48247* (2013.01); *H01L 2224/49171* (2013.01)

(56) References Cited

U.S. PATENT DOCUMENTS

| | | |
|---|---|---|
| 6,501,330 B2 | 12/2002 | Kasa et al. |
| 7,095,999 B2 | 8/2006 | Kasa et al. |
| 8,525,295 B2 | 9/2013 | Nakashiba |
| 9,147,646 B2 | 9/2015 | Shimizu et al. |
| 2002/0117750 A1 | 8/2002 | Kojima et al. |
| 2009/0302420 A1* | 12/2009 | Nakashiba .......... H01L 23/5227 257/531 |
| 2010/0035383 A1* | 2/2010 | Zhao .................. H01L 23/3128 438/119 |
| 2010/0187663 A1* | 7/2010 | Celaya ................ H01L 21/561 257/666 |
| 2013/0043940 A1* | 2/2013 | Hebert ................ H01L 23/3732 327/564 |

FOREIGN PATENT DOCUMENTS

| | | |
|---|---|---|
| JP | 07-161911 A | 6/1995 |
| JP | 2001244416 A | 9/2001 |
| JP | 2002252328 A | 9/2002 |
| JP | 2009266934 A | 11/2009 |
| JP | 2009-295804 A | 12/2009 |
| JP | 2011-142175 A | 7/2011 |
| JP | 2013-33822 A | 2/2013 |
| WO | 9966557 A1 | 12/1999 |

OTHER PUBLICATIONS

Communication dated Aug. 30, 2016, from the Japanese Patent Office in counterpart application No. 2013-054817.
Communication dated Mar. 14, 2017, from the Japanese Patent Office in counterpart application No. 2013-054817.
Communication dated Aug. 29, 2017, from the Japanese Patent Office in counterpart Japanese application No. 2013-054817.

* cited by examiner

SEMICONDUCTOR DEVICE

This application is based on Japanese patent application No. 2013-54817, the content of which is incorporated hereinto by reference.

BACKGROUND

Technical Field

The present invention relates to a semiconductor device, and to a technique applicable to, for example, a semiconductor device provided with a first circuit and a second circuit having reference potentials different from each other.

Related Art

When a signal is transmitted and received between two circuits having reference voltages different from each other, photo-couplers are generally used. On the other hand, in recent years, there has been developed a technique in which a signal is transmitted and received between two circuits by inductively coupling or capacitively coupling two inductors (see Japanese Unexamined Patent Publication No. 2011-142175). The use of the technique allows the above-mentioned two circuits to be mounted to one semiconductor chip, for example, as disclosed in Japanese Unexamined Patent Publication No. 2009-295804.

The inventor has examined the formation of two circuits having a large difference between reference potentials using one silicon-on-insulator (SOI) substrate. In this case, noise coming into a circuit having a relatively large reference potential (hereinafter, referred to as a first circuit) becomes a very large value for a circuit having a relatively small reference potential (hereinafter, referred to as a second circuit). For this reason, even when a region in which the first circuit is formed and a region in which the second circuit is formed are insulated from each other in a semiconductor layer of the SOI substrate, it has turned out that noise is propagated from the first circuit to the second circuit through a semiconductor substrate serving as a base. Consequently, the inventor has examined the suppression of the propagation of the noise.

Other problems and novel features will be made clearer from the description and the accompanying drawings of the present specification.

SUMMARY

In one embodiment, a substrate of a semiconductor device includes a semiconductor substrate, a buried insulating layer formed over the semiconductor substrate, and a semiconductor layer formed over the buried insulating layer. An isolation insulating layer, buried in the semiconductor layer so as to reach the buried insulating layer, which insulates a first circuit forming region of the semiconductor layer from a second circuit forming region thereof is buried in the semiconductor layer so as to reach the buried insulating layer. The first circuit is formed using the first circuit forming region, and the second circuit is formed using the second circuit forming region. The first circuit forming region is connected to a first electrode pad, and the second circuit forming region is connected to a second electrode pad. The semiconductor substrate is not electrically connected to the first electrode pad and the second electrode pad.

According to the embodiment, it is possible to suppress the propagation of noise from the first circuit to the second circuit through the semiconductor substrate.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described with reference to the accompanying drawings. In all the drawings, like elements are referenced by like reference numerals and descriptions thereof will not be repeated.

(First Embodiment)

Figure 1:
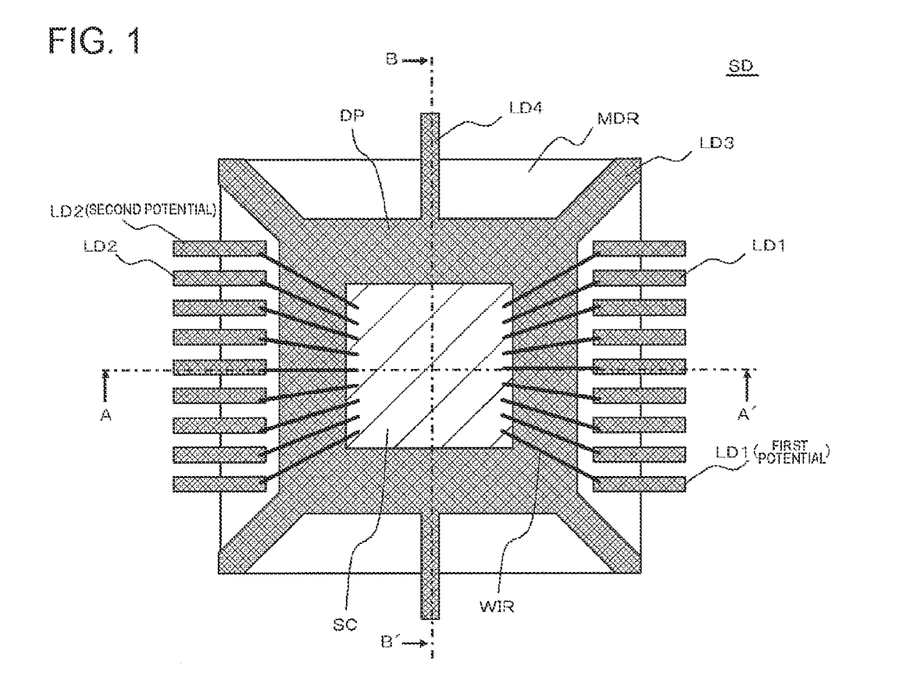
FIG. 1 is a plan view illustrating a configuration of a semiconductor device according to a first embodiment.
Figure 2:
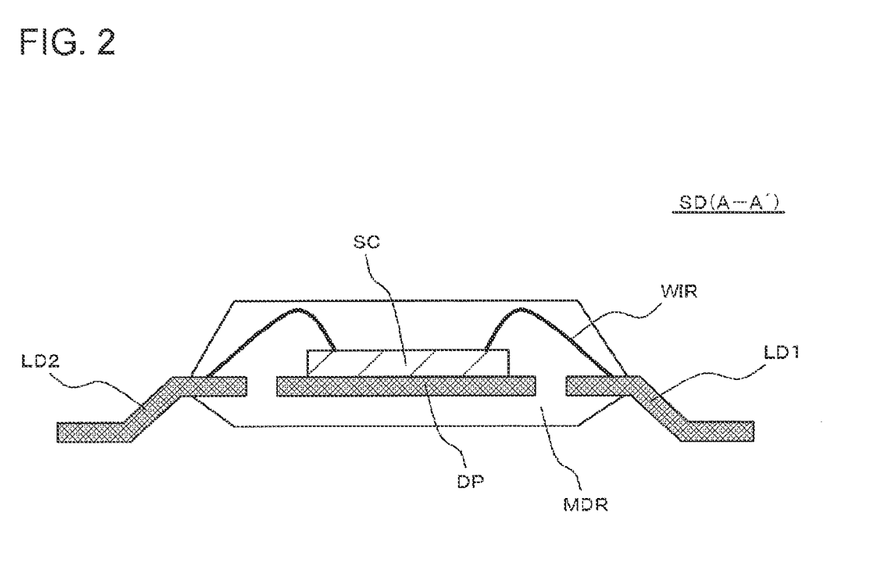
FIG. 2 is a cross-sectional view taken along line A-A' of FIG. 1.
Figure 3:
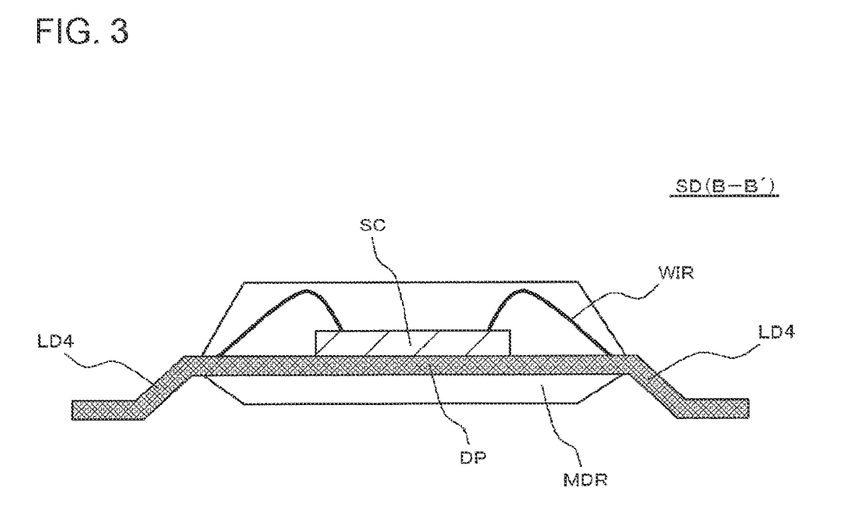
FIG. 3 is a cross-sectional view taken along line B-B' of FIG. 1.

FIG. 1 is a plan view illustrating a configuration of a semiconductor device SD according to a first embodiment. FIG. 2 is a cross-sectional view taken along line A-A' of FIG. 1, and FIG. 3 is a cross-sectional view taken along line B-B' of FIG. 1. The semiconductor device SD is configured such that a rectangular semiconductor chip SC is mounted on a die pad DP (an example of a substrate mounting member) of a lead frame, and the die pad DP and the semiconductor chip SC are sealed with a sealing resin MDR. The lead frame is formed of a conductive material such as, for example, copper.

The lead frame includes lead terminals LD1 and LD2. A plurality of lead terminals LD1 face the first side of the semiconductor chip SC, and a plurality of lead terminals LD2 face the opposite side (second side) to the first side of the semiconductor chip SC. The lead terminals LD1 and LD2 and the semiconductor chip SC are connected to each other using bonding wires WIR. Meanwhile, the bonding wires WIR are also sealed with the sealing resin MDR.

The semiconductor chip SC includes a first circuit CIR1 (details thereof will be described later) and a second circuit CIR2 (details thereof will be described later). The first circuit CIR1 and the second circuit CIR2 have reference potentials (ground potentials) different from each other. A first potential which is a reference potential of the first circuit CIR1 is applied to the semiconductor chip SC through any of the plurality of lead terminals LD1, and a second potential which is a reference potential of the second circuit CIR2 is applied to the semiconductor chip SC through any of the plurality of lead terminals LD2. In the example shown in the drawing, the lead terminals LD1 for applying the first potential and the lead terminals LD2 for applying the second potential are arranged at positions which are point-symmetric to each other with reference to the semiconductor chip SC. For example, the first potential is applied to the semiconductor chip SC through the lead terminal LD1 closest to a corner (first corner) of the die pad DP, and the second potential is applied to the semiconductor chip SC through the lead terminal LD2 closest to a corner (second corner) which is located point-symmetrically to the first corner.

The lead frame further includes a suspension lead LD3 and a lead terminal LD4 for a substrate potential (an example of conducting members). The suspension lead LD3 and the lead terminal LD4 for a substrate potential is connected to the die pad DP. In the example shown in the drawing, the suspension lead LD3 and the lead terminal LD4 for a substrate potential are formed integrally with the die pad DP.

The suspension lead LD3 is configured such that one end thereof is connected to the corner of the die pad DP, and that the other end thereof is located at an end face of the sealing resin MDR. For example, when the planar shape of the die pad DP is rectangular, each suspension lead LD3 is provided to each of four corners of the die pad DP.

The lead terminal LD4 for a substrate potential is configured such that one end thereof is connected to the die pad DP, and that the other end thereof is located outside the sealing resin MDR, and serves as a terminal for external connection. The lead terminal LD4 for a substrate potential is a terminal for applying a reference potential to the die pad DP. In addition, the lead terminal LD4 for a substrate potential is provided to two sides which face neither the lead terminal LD1 nor the lead terminal LD2 out of four sides of the die pad DP. The lead terminal LD4 for a substrate potential is connected to the center of each of the two sides. With such a configuration, it is possible to suppress the propagation of noise from the lead terminals LD1 and LD2 to the lead terminal LD4 for a substrate potential. Meanwhile, the number of lead terminals LD4 for a substrate potential is not limited to the example shown in the drawing. For example, when the number of lead terminals LD4 for a substrate potential is increased, the potential of a semiconductor substrate BSB of a substrate SUB is stabilized, and a noise transmission suppression effect described later becomes large.

Meanwhile, based on the die pad DP, it is preferable that the terminal for external connection of the lead terminal LD4 for a substrate potential be located at the same height as terminals for external connection of the lead terminals LD1 and LD2.

Figure 4:
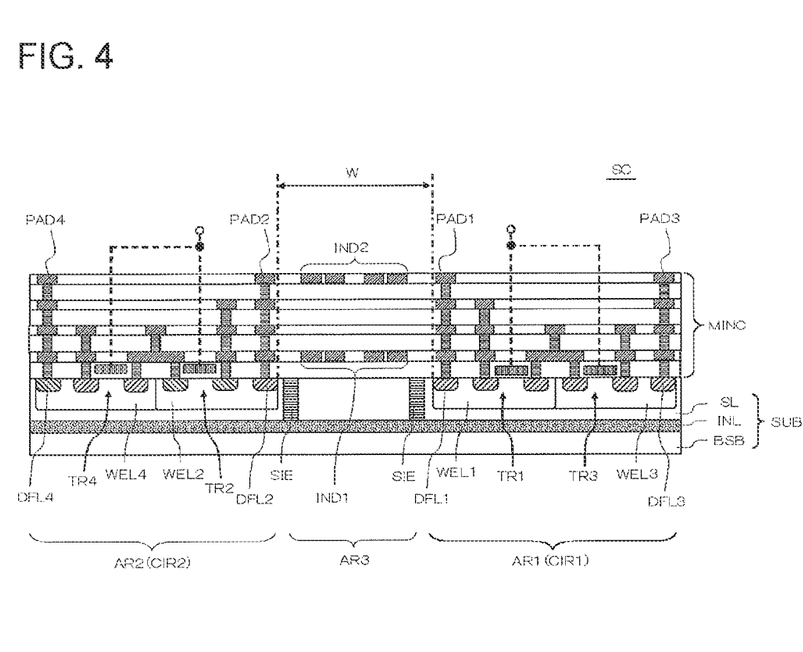
FIG. 4 is a cross-sectional view illustrating a structure of a semiconductor chip.

FIG. 4 is a cross-sectional view illustrating a structure of the semiconductor chip SC. The semiconductor chip SC is formed using the substrate SUB. The substrate SUB has a structure in which a buried insulating layer INL and a semiconductor layer SL of a first conductivity type (for example, p type) are formed in this order on the semiconductor substrate BSB such as an SOI substrate. The thickness of the semiconductor substrate BSB is, for example, equal to or less than 100 μm, and preferably equal to or less than 50 μm. In addition, the thickness of the semiconductor substrate BSB decreases so as to be smaller than a width between a first well WEL1 and a second well WEL2 described later.

A fixed potential is applied to the semiconductor substrate BSB through the die pad DP and the lead terminal LD4 for a substrate potential. The fixed potential is applied to the semiconductor chip SC through a different route from the first potential and the second potential described later. That is, the semiconductor substrate BSB is not electrically connected to a first electrode pad PAD1 (described later) and a second electrode pad PAD2 (described later). In addition, a multilayer interconnect layer MINC is formed on the substrate SUB. Electrode pads are formed on an uppermost interconnect layer. The bonding wires WIR are connected to these electrode pads.

The semiconductor chip SC includes the first circuit CIR1 and the second circuit CIR2. The first circuit CIR1 is formed using a first circuit forming region AR1 of the semiconductor layer SL located on the buried insulating layer INL, and the second circuit CIR2 is formed using a second circuit forming region AR2 of the semiconductor layer SL located on the buried insulating layer INL.

The first circuit CIR1 includes a transistor TR1 of a second conductivity type (for example, n type) and a transistor TR3 of a first conductivity type. The transistor TR1 is formed using the first well WEL1 of the semiconductor layer SL, and the transistor TR3 is formed using a third well WEL3 of the semiconductor layer SL. The first well WEL1 is a first conductivity type, and the third well WEL3 is a second conductivity type.

The first well WEL1 is connected to the first electrode pad PAD1 through a diffusion layer DFL1, a contact, a via, and an interconnect. The first well WEL1 has the same conductivity type as that of the semiconductor layer SL, and thus the reference potential (first potential) of the first circuit is applied to the semiconductor layer SL located at the first circuit forming region AR1 through the first well WEL1 and the first electrode pad PAD1.

In addition, the third well WEL3 is connected to a third electrode pad PAD3 through a diffusion layer DFL3, a contact, a via, and an interconnect. A power supply potential of the first circuit is applied to the third electrode pad PAD3.

The second circuit CIR2 includes a transistor TR2 of a second conductivity type and a transistor TR4 of a first conductivity type. The transistor TR2 is formed using the second well WEL2 of the semiconductor layer SL, and the transistor TR4 is formed using a fourth well WEL4 of the semiconductor layer SL. The second well WEL2 is a first conductivity type, and the fourth well WEL4 is a second conductivity type.

The second well WEL2 is connected to the second electrode pad PAD2 through a diffusion layer DFL2, a contact, a via, and an interconnect. The second well WEL2 has the same conductivity type as that of the semiconductor layer SL, and thus the reference potential (second potential) of the second circuit is applied to the semiconductor layer SL located at the second circuit forming region AR2 through the second well WEL2 and the second electrode pad PAD2.

In addition, the fourth well WEL4 is connected to a fourth electrode pad PAD4 through a diffusion layer DFL4, a contact, a via, and an interconnect. A power supply potential of the second circuit is applied to the fourth electrode pad PAD4.

Meanwhile, the thickness of the semiconductor substrate BSB is smaller than an interval between the first well WEL1 and the second well WEL2, that is, a width W of a region located therebetween. It is preferable that the thickness of the semiconductor substrate BSB be smaller than the minimum value of the width W. In this manner, in the present embodiment, the semiconductor substrate BSB is formed to have a small thickness. Thereby, before noise is propagated between the first well WEL1 and the second well WEL2 through the semiconductor substrate BSB, noise escapes outside the semiconductor substrate BSB.

In addition, the first electrode pad PAD1, the second electrode pad PAD2, the third electrode pad PAD3, and the fourth electrode pad PAD4 are insulated from each other within the semiconductor device SD. In addition, the first well WEL1 and the second well WEL2 may not be formed.

An isolation insulating layer SIE is formed in a region (inductor forming region AR3) between the first circuit forming region AR1 and the second circuit forming region AR2 in the semiconductor layer SL. The isolation insulating layer SIE is configured such that the upper end thereof is located on the upper surface of the semiconductor layer SL, and that the lower end thereof reaches the buried insulating layer INL. For this reason, the first circuit forming region AR1 and the second circuit forming region AR2 in the semiconductor layer SL are insulated from each other and are isolated from each other by the isolation insulating layer SIE and the buried insulating layer INL. For this reason, even when a difference between the first potential which is a reference potential of the first circuit CIR1 and the second potential which is a reference potential of the second circuit CIR2 is large (for example, equal to or higher than 100 V), the first circuit CIR1 and the second circuit CIR2 are not short-circuited. In the example shown in the drawing, the isolation insulating layer SIE is provided each between the inductor forming region AR3 and the first circuit forming region AR1, and between the inductor forming region AR3 and the second circuit forming region AR2.

A first inductor IND1 and a second inductor IND2 are formed in a portion located on the inductor forming region AR3 in the multilayer interconnect layer MINC. The first inductor IND1 and the second inductor IND2 are located on interconnect layers different from each other, and overlap each other when seen in a plan view. In the example shown in the drawing, the first inductor IND1 is formed on a lowermost interconnect layer, and the second inductor IND2 is located on an uppermost interconnect layer. However, the first inductor IND1 and the second inductor IND2 may be formed on interconnect layers other than these layers. In addition, the structures of the inductors are, of course, not limited to the present embodiment.

The first inductor IND1 is connected to one of the first circuit CIR1 and the second circuit CIR2, and the second inductor IND2 is connected to the other of the first circuit CIR1 and the second circuit CIR2. The transmission of a signal between the first circuit CIR1 and the second circuit CIR2 is performed through the first inductor IND1 and the second inductor IND2. Meanwhile, the first inductor IND1 and the second inductor IND2 may be inductively coupled to each other, and may be capacitively coupled to each other.

Figure 5:
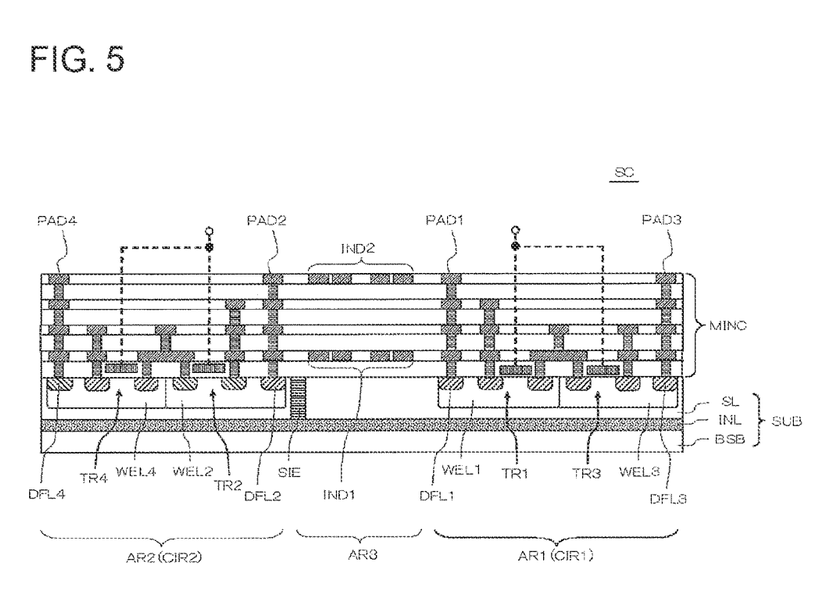
FIG. 5 is a cross-sectional view illustrating a modified example of FIG. 4.

FIG. 5 is a cross-sectional view illustrating a modified example of FIG. 4. In the example shown in the drawing, the isolation insulating layer SIE is provided either between the inductor forming region AR3 and the first circuit forming region AR1 or between the inductor forming region AR3 and the second circuit forming region AR2.

Next, the operations and effects of the present embodiment will be described. As mentioned above, the reference potential (first potential) of the first circuit CIR1 and the reference potential (second potential) of the second circuit CIR2 are different from each other. In the following description, the first potential is assumed to be higher than the second potential. A case where noise comes into the first electrode pad PAD1 of the first circuit CIR1 is considered. Since the first potential applied to the first electrode pad PAD1 is high, an absolute value of the noise coming into the first electrode pad PAD1 may be large. For this reason, as in a general circuit, when one of the first electrode pad PAD1 and the second electrode pad PAD2 is electrically connected to the semiconductor substrate BSB, there is the possibility of the noise having come into the first electrode pad PAD1 being propagated to the second circuit forming region AR2 of the semiconductor layer SL through the semiconductor substrate BSB.

On the other hand, in the present embodiment, neither the first electrode pad PAD1 nor the second electrode pad PAD2 is electrically connected to the semiconductor substrate BSB. Therefore, it is possible to suppress the occurrence of the above-mentioned problem.

In addition, when the potential of the first circuit forming region AR1 in the semiconductor layer SL fluctuates by noise in a case where the absolute value of the noise coming into the first electrode pad PAD1 is large, there is a concern that the fluctuation may be propagated even to the potential of the semiconductor substrate BSB through the buried insulating layer INL. When the potential of the semiconductor substrate BSB fluctuates, the potential of the second circuit forming region AR2 of the semiconductor layer SL also fluctuates, there is the possibility of the second circuit CIR2 malfunctioning. Such a problem becomes conspicuous as the difference between the first potential and the second potential becomes large.

On the other hand, in the present embodiment, a potential is applied to the semiconductor substrate BSB through the die pad DP and the lead terminal LD4 for a substrate potential. Therefore, even when noise which is input to the first circuit forming region AR1 is propagated to the semiconductor substrate BSB, it is possible to suppress the fluctuation of the potential of the semiconductor substrate BSB. Therefore, it is possible to suppress the propagation of the noise to the second circuit forming region AR2.

In addition, in the present embodiment, the semiconductor substrate BSB is thin. Therefore, even when noise is propagated from the first circuit forming region AR1 to the semiconductor substrate BSB, the noise is not likely to be propagated through the semiconductor substrate BSB. Therefore, it is possible to further suppress the propagation of noise to the second circuit forming region AR2.

(Second Embodiment)

Figure 6:
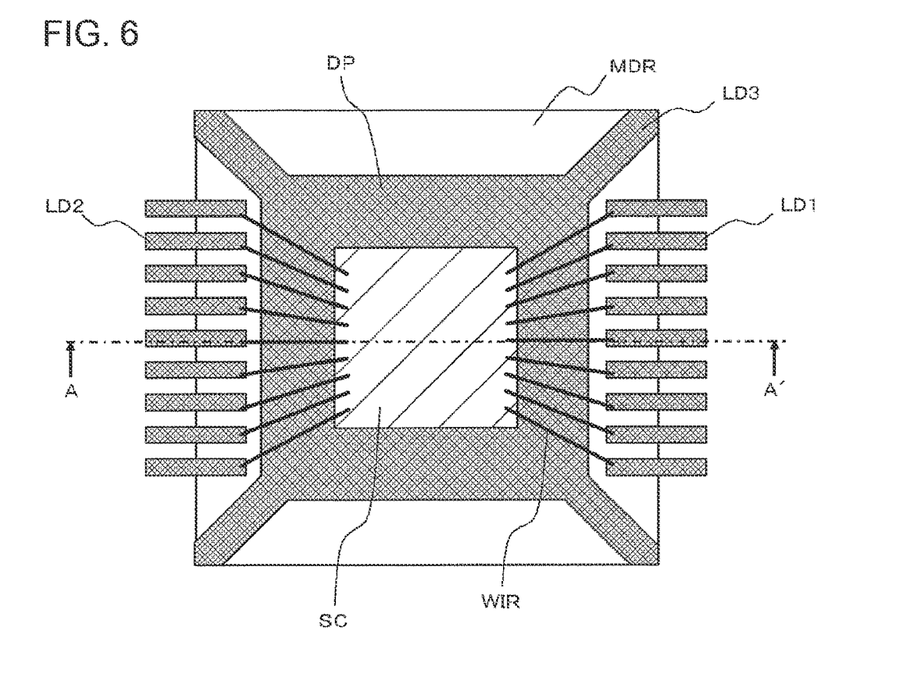
FIG. 6 is a plan view illustrating a configuration of a semiconductor device according to a second embodiment.
Figure 7:
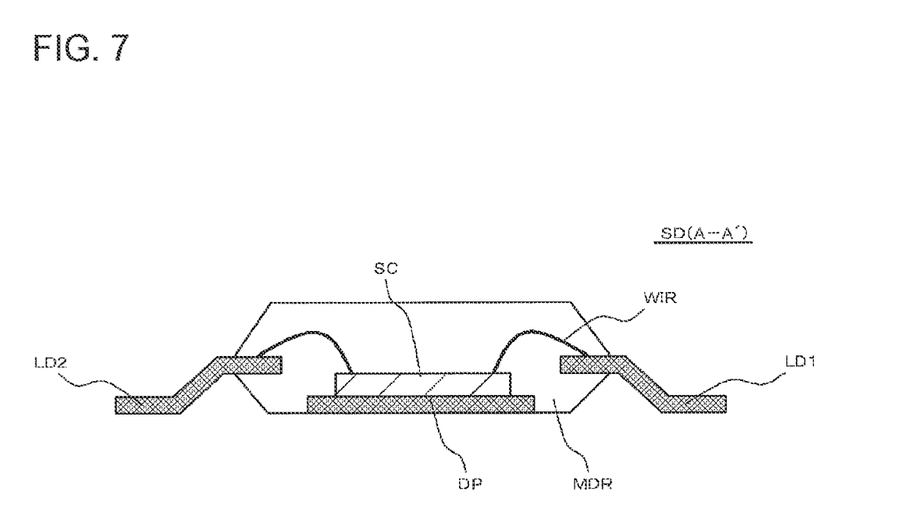
FIG. 7 is a cross-sectional view taken along line A-A' of FIG. 6.

FIG. 6 is a plan view illustrating a configuration of a semiconductor device SD according to a second embodiment. FIG. 7 is a cross-sectional view taken along line A-A' of FIG. 6. The semiconductor device SD according to the present embodiment has the same configuration as that of the semiconductor device SD according to the first embodiment, except for the following points.

First, the lead frame is not provided with the lead terminal LD4 for a substrate potential. Instead, the surface of the die pad DP opposite to the surface on which the semiconductor chip SC is mounted is exposed from the sealing resin MDR. That is, in the present embodiment, the die pad DP serves as a potential transmission portion, and a fixed potential is applied to the semiconductor substrate BSB of the semiconductor chip SC through the backside of the die pad DP. Meanwhile, a bonding wire that connects the die pad DP and the electrode pad of the semiconductor chip SC is not provided. For this reason, a potential is applied to the semiconductor substrate BSB through a route different from the first potential and the second potential of the semiconductor chip SC.

In the present embodiment, it is also possible to obtain the same effect as that in the first embodiment.

(Third Embodiment)

Figure 8:
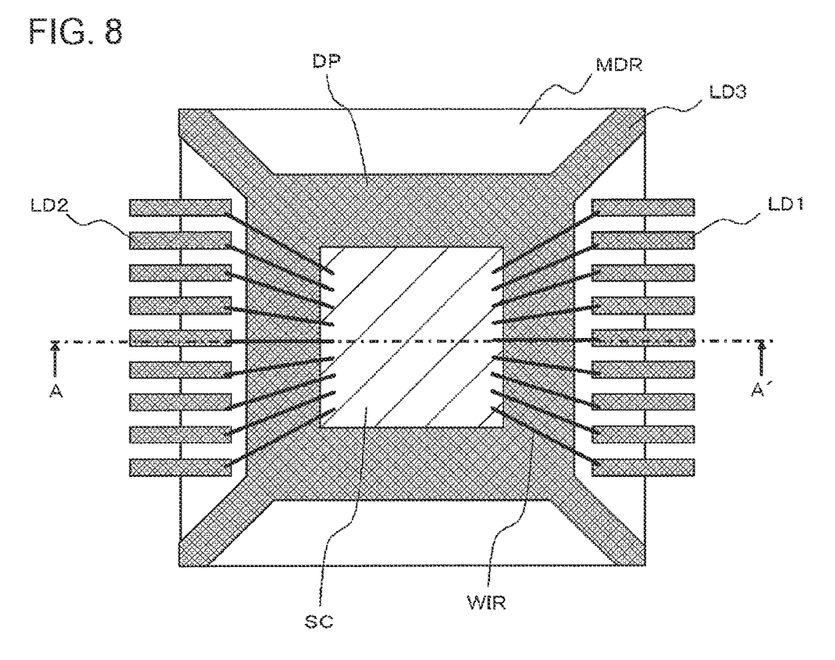
FIG. 8 is a plan view illustrating a configuration of a semiconductor device according to a third embodiment.
Figure 9:
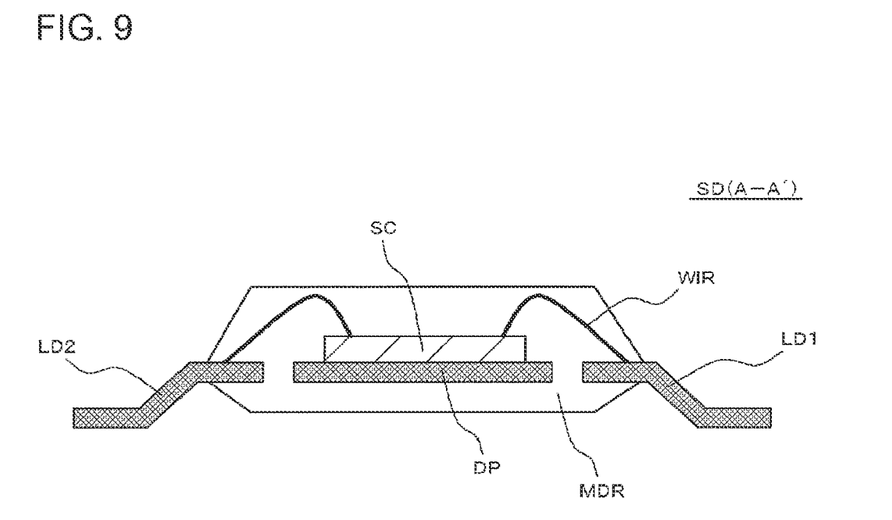
FIG. 9 is a cross-sectional view taken along line A-A' of FIG. 8.

FIG. 8 is a plan view illustrating a configuration of a semiconductor device SD according to a third embodiment. FIG. 9 is a cross-sectional view taken along line A-A' of FIG. 8. The semiconductor device SD according to the present embodiment has the same configuration as that of the semiconductor device SD according to the first embodiment, except that there is no lead terminal LD4 for a substrate potential. For this reason, in the present embodiment, the die pad DP and the semiconductor substrate BSB are floating.

In the present embodiment, neither the first electrode pad PAD1 nor the second electrode pad PAD2 is also electrically connected to the semiconductor substrate BSB. Therefore, it is possible to lower the possibility of the noise having come into the first electrode pad PAD1 being propagated to the second circuit forming region AR2 of the semiconductor layer SL through the semiconductor substrate BSB.

As stated above, while the invention devised by the inventor has been described specifically based on the embodiments thereof, the present invention is not limited to the above-mentioned embodiments, but it goes without saying that various changes and modifications may be made without departing from the scope of the invention. According to the above-mentioned embodiments, in the semiconductor device in which two circuits having a large difference between reference potentials are formed using one SOI substrate, it is possible to suppress the propagation of noise from the first circuit to the second circuit through the semiconductor substrate.

It is apparent that the present invention is not limited to the above embodiment, and may be modified and changed without departing from the scope and spirit of the invention.

What is claimed is:

1. A semiconductor device comprising:
a substrate including a semiconductor substrate, a buried insulating layer formed over the semiconductor substrate, and a semiconductor layer formed over the buried insulating layer;
an isolation insulating layer, buried in the semiconductor layer so as to reach the buried insulating layer, which insulates a first circuit forming region of the semiconductor layer from a second circuit forming region thereof;
a first circuit formed using the first circuit forming region;
a second circuit formed using the second circuit forming region;
a first lead, a second lead, a third lead, a fourth lead, and a substrate mounting member, the substrate mounting member comprising a first side, a second side opposite the first side, a third side between the first side and the second side, and a fourth side opposite the third side,
wherein the substrate mounting member is connected to the semiconductor substrate and is not directly electrically connected to the first lead and the second lead,
wherein the first lead comprises one end and another end opposite the one end,
wherein the second lead comprises one end and another end opposite the one end,
wherein the third lead comprises one end and another end opposite the one end, and
wherein the fourth lead comprises one end and another end opposite the one end;
a first electrode pad which is connected to the first circuit forming region and the first lead;
a second electrode pad which is connected to the second circuit forming region and the second lead; and
a sealing resin that seals the substrate, the first lead, the second lead, the third lead, the fourth lead, and the substrate mounting member, the sealing resin comprising a first side surface, a second side surface opposite the first side surface, a third side surface between the first side surface and the second side surface, and a fourth side surface opposite the third side surface, wherein the first side, the second side, the third side, and the fourth side of the substrate mounting member face the first side surface, the second side surface, the third surface, and the fourth side surface of the sealing resin, respectively,
wherein the semiconductor substrate is not directly electrically connected to the first electrode pad and the second electrode pad,
wherein the one end of the first lead faces the first side of the substrate mounting member and the another end of the first lead is exposed from the first side surface of the sealing resin,
wherein the one end of the second lead faces the second side of the substrate mounting member and the another end of the second lead is exposed from the second side surface of the sealing resin,
wherein the one end of the third lead is connected to a corner between the first side and the third side of the substrate mounting member and the another end of the third lead is in contact with a corner between the first side surface and the third side surface of the sealing resin without extending outwardly from the corner between the first side surface and the third side surface of the sealing resin, and
wherein the one end of the fourth lead is connected to one of the third side and the fourth side of the substrate mounting member and the another end of the fourth lead is exposed from one of the third side surface and the fourth side surface of the sealing resin, wherein the one of the third side and the fourth side of the substrate mounting member faces the one of the third side surface and the fourth side surface of the sealing resin.

2. The semiconductor device according to claim 1, further comprising a potential transmission portion that applies a potential to the semiconductor substrate.

3. The semiconductor device according to claim 2, wherein the potential transmission portion includes:
a conductive substrate mounting member that mounts the substrate; and
a conducting member which is configured such that one end thereof is connected to the substrate mounting member, and the other end thereof serves as a terminal.

4. The semiconductor device according to claim 2, wherein the potential transmission portion includes a conductive substrate mounting member that mounts the substrate on one surface, and is further provided with:
a multilayer interconnect layer, formed over the semiconductor layer of the substrate, which includes the first electrode pad and the second electrode pad; and
a sealing resin that seals a surface of the substrate over which the multilayer interconnect layer is formed,
wherein a surface of the substrate mounting member opposite to the one surface is exposed from the sealing resin, and there is no bonding wire connecting the one surface of the substrate mounting member and the multilayer interconnect layer.

5. The semiconductor device according to claim 1, further comprising:
a first well formed in the first circuit forming region; and
a second well formed in the second circuit forming region, wherein a thickness of the semiconductor substrate is smaller than a distance between the first well and the second well.

6. The semiconductor device according to claim 1, wherein the thickness of the semiconductor substrate is equal to or less than 100 μm.

7. The semiconductor device according to claim 1, wherein the semiconductor substrate is floating.

8. The semiconductor device according to claim 1, wherein a difference between a first potential applied to the first electrode pad and a second potential applied to the second electrode pad is equal to or higher than 100 V.

9. The semiconductor device according to claim 8, further comprising:
   a first inductor which is connected to the first circuit; and
   a second inductor which is connected to the second circuit, and faces the first inductor.

10. The semiconductor device according to claim 1, the third lead is connected to the substrate mounting member, and wherein the third lead extends in a direction that intersects with a direction that the first lead extends.

11. The semiconductor device according to claim 1, wherein the first lead is connected to the first electrode pad and a first reference potential is applied to the first circuit forming region through the first lead; the second lead is connected to the second electrode pad, and a second reference potential is applied to the second circuit forming region through the second lead; and a third reference potential is applied to the substrate through the substrate mounting lead, the substrate mounting lead is electrically insulated from the first lead and the second lead.

\* \* \* \* \*